(12) United States Patent
Benwadih

(10) Patent No.: US 8,258,504 B2
(45) Date of Patent: Sep. 4, 2012

(54) ORGANIC FIELD-EFFECT TRANSISTOR AND METHOD OF FABRICATING THIS TRANSISTOR

(75) Inventor: Mohamed Benwadih, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 142 days.

(21) Appl. No.: 12/628,415

(22) Filed: Dec. 1, 2009

(65) Prior Publication Data
US 2010/0096625 A1   Apr. 22, 2010

Related U.S. Application Data

(63) Continuation of application No. PCT/FR2008/051330, filed on Jul. 15, 2008.

(30) Foreign Application Priority Data

Jul. 13, 2007   (FR) ..................... 07 05096

(51) Int. Cl.
  *H01L 35/24*   (2006.01)

(52) U.S. Cl. ............... 257/40; 257/E51.001; 438/99

(58) Field of Classification Search ............ 257/40, 257/E51.001
See application file for complete search history.

(56) References Cited

U.S. PATENT DOCUMENTS

| 2005/0104060 A1 | 5/2005 | Halik et al. |
| 2006/0108581 A1 | 5/2006 | Ahn et al. |
| 2006/0273303 A1* | 12/2006 | Wu et al. ............... 257/40 |

FOREIGN PATENT DOCUMENTS

EP   1 732 150 A1   12/2006

OTHER PUBLICATIONS

M.K. Ram, et al., "Dielectric Relaxation in Thin Conducting Polyaniline Films," Polymer, Elsevier Science Publishers, B.V., GB, vol. 39, No. 15, Jul. 1998, pp. 3399-3404.
Eiji Kuwahara, et al., "Fabrication of Ambipolar Field-Effect Transistor Device with Heterostructure of $C_{60}$ and Pentacene," Applied Physics Letters, American Institute of Physics, Melville, NY, vol. 85, No. 20, Nov. 15, 2004, pp. 4765-4767.
A. Dodabalapur, et al., "Organic Heterostructure Field-Effect Transistors," Science, American Association for the Advancement of Science, vol. 269, Sep. 15, 1995, pp. 1560-1562.

* cited by examiner

*Primary Examiner* — Anthony Ho
(74) *Attorney, Agent, or Firm* — Burr & Brown

(57) ABSTRACT

This organic field effect transistor comprises a semiconductor layer made of an organic semiconductor material. The mobility $\mu_{sup}$ of the charge carriers in the first portion of the semiconductor layer is X times greater than the mobility $\mu_{inf}$ of the charge carriers in the second portion of the semiconductor layer, with the first portion corresponding to 10% of the volume of the semiconductor layer closest to the gate electrode and the second portion corresponding to 10% of the volume of the semiconductor layer closest to the drain and source electrodes.

12 Claims, 2 Drawing Sheets

ORGANIC FIELD-EFFECT TRANSISTOR AND METHOD OF FABRICATING THIS TRANSISTOR

BACKGROUND OF THE INVENTION

1. Field of the Invention

The present invention relates to an organic field effect transistor and a method for producing such a transistor.

2. Description of Related Art

Currently known organic field effect transistors comprise:
drain and source electrodes,
a semiconductor layer made of an organic semiconductor material arranged between the drain and source electrodes,
at least one gate electrode, and
an electrically insulating layer interposed between the gate electrode and the semiconductor layer with the insulating layer being directly in contact with the semiconductor layer, When a potential is applied to the gate electrode, the charge carriers present in the semiconductor layer concentrate at the interface between the semiconductor layer and the insulating material, remaining confined to the semiconductor layer. This concentration of charge carriers then forms the conduction channel which is characteristic of the "on" state of the transistor.

Organic field effect transistors are produced using organic semiconductor materials. Such organic field effect transistors are also referred to by the abbreviation OFET.

An organic semiconductor or an organic semiconductor material is an organic compound in the than of a crystal or polymer which exhibits properties that are similar to those of inorganic semiconductors. These properties include conduction by electrons and holes and the presence of an energy gap. These materials gave rise to organic electronics.

The mobility $\mu$ of the charge carriers in an organic semiconductor is defined by the following equation in the absence of a magnetic field and in the steady-state regime:

$$\vec{V} = \mu \vec{E} \qquad (0)$$

where:

$\vec{V}$ is the velocity of the charge carriers in the organic semiconductor, and $\vec{E}$ is the permanent electrostatic field.

Mobility $\mu$ is expressed in centimeters squared per volt per second ($cm^2 V^{-1} s^{-1}$).

The mobility of charge carriers in organic semiconductors currently remains well below that in inorganic semiconductors; it does not exceed 20-35 $cm^2 \cdot V^{-1} \cdot s^{-1}$ whereas, in inorganic semiconductors, it is of the order of $10^3$ $cm^2 \cdot V^{-1} \cdot s^{-1}$. There is a proportionality relationship between the mobility of the charge carriers and the electrical conductivity a of a material which can be expressed as follows:

$$\sigma = pq\mu \qquad (1)$$

where:
q is the charge of the charge carriers,
p represents the volume concentration of the charge carriers, and
$\mu$ represents the mobility of the charge carriers.

The $I_{on}/I_{off}$ ratio is one of the criteria for measuring the quality of a transistor. This ratio $I_{on}/I_{off}$ is the ratio of the intensity of current $I_{on}$ which flows through the transistor when the latter is in the "on" state to the intensity of the current $I_{off}$ which flows through the same transistor under the same conditions when it is in the off or "blocked" state. In particular, current intensity $I_{on}$ and current intensity $I_{off}$ are measured with the same voltage $V_{ds}$ between the drain and the source.

In known organic transistors, the semiconductor layer is made by using a single identical organic semiconductor whose mobility, at micrometer scale, is homogeneous throughout the semiconductor.

In order to increase the maximum current intensity $I_{on}$ which can flow through the transistor for several tens of seconds without damaging it, attempts are currently being made to use organic semiconductors which have the highest possible mobility. There are, for example, organic semiconductors which have a mobility in excess of $10^{-1}$ $cm^2 V^{-1} s^{-1}$ or even 1 $cm^2 V^{-1} s^{-1}$; these can be used to produce the semiconductor layer.

However, for a transistor with a given geometry, increasing the maximum current intensity $I_{on}$ does not necessarily result in an increase in the $I_{on}/I_{off}$ ratio because of the proportionality relationship between charge carrier mobility and conductivity. In fact, for most organic semiconductors, the higher the mobility, the more the conductivity of the material increases and current $I_{off}$ therefore increases. Here, the geometry of a transistor is deemed to remain constant if the distance L between the opposite-facing faces of the drain and source electrodes and the length W of the channel which separates the drain and source electrodes remain constant. These parameters L and W are described in greater detail later on in this description.

The best organic transistors currently have an $I_{on}/I_{off}$ ratio which peaks at around $10^5$.

SUMMARY OF THE INVENTION

The invention therefore aims to propose an organic transistor having a design which is enhanced in order to increase the $I_{on}/I_{off}$ ratio.

The object of the invention is therefore an organic field effect transistor (hereinafter organic transistor) wherein the semiconductor material is not homogeneous or, more especially, wherein the charge carrier mobility is not homogeneous throughout the volume of the semiconductor material which separates the drain, source and gate electrodes. According to the invention, the mobility $\mu_{sup}$ of the charge carriers in a first portion of the semiconductor layer which is closest to the gate exceeds the mobility $\mu_{inf}$ of the charge carriers in a second portion of the semiconductor layer which is closest to the drain and source electrodes. The first portion is therefore interposed between the second portion and the gate electrode whereas the second portion is interposed between the first portion and the drain and source electrodes.

According to one embodiment, the first portion is in contact with an insulating layer which separates the first portion from the gate electrode whereas the second portion is in contact with the drain and source electrodes and is interposed between the latter as well as between the first portion, on the one hand, and the drain and source electrodes, on the other hand. The first portion is also interposed between the insulating layer and a second portion.

According to one embodiment of the invention, the mobility $\mu_{sup}$ of the charge carriers in the first portion of the semiconductor layer is X times greater than the mobility $\mu_{inf}$ of the charge carriers in the second portion of the semiconductor layer when these mobilities $\mu_{inf}$ and $\mu_{sup}$ are measured under the same conditions, X being a number equal to or greater than 10. In this embodiment, the first portion corresponds, for example, to at least 10% of the volume of the semiconductor layer which is closest to the gate electrode whereas the second portion corresponds to at least 10% of the volume of the semiconductor layer which is closest to the drain and source electrodes.

In the above organic transistor, the second portion physically isolates the first portion from the drain and source electrodes. The second portion is therefore physically interposed between, firstly, the drain and source electrodes and, secondly, the gate electrode(s). The second portion is also at least partly interposed between the drain electrode and the source electrode. Thus, in the "off" state, the conduction path is established between the drain and source electrodes in the second portion where mobility $\mu_{inf}$ is lower. The second portion therefore makes it possible to obtain a lower current $I_{off}$ than if the mobility were the same and equal to $\mu_{sup}$ throughout the entire semiconductor layer.

Conversely, in the "on" state, the first portion is located in the location where the conduction channel is created when the transistor is in the "on" state. The first portion has a mobility $\mu_{sup}$ which is much higher than mobility $\mu_{inf}$. Thus, the velocity at which the charge carriers flow between the drain and source electrodes is much higher than if the mobility were the same and equal to $\mu_{inf}$ throughout the entire volume of the semiconductor layer. This therefore results in an increase in the intensity of current $I_{on}$. Thus, the $I_{on}/I_{off}$ ratio, and hence the performance of the organic field effect transistor, is very markedly improved by using the first and second portions in combination.

The embodiments of this organic transistor may comprise one or more of the following features:
  The first portion comprises:
    a matrix of an organic semiconductor material having a mobility $\mu_{sup}$ which occupies at least 90% of the first portion, and
    inorganic semiconductor particles having a mobility $\mu_{sup2}$ which are uniformly distributed throughout the matrix and occupy at least 10% of the first portion, the smallest width of the inorganic semiconductor particles exceeding 10 nm so that the mobility $\mu_{sup}$ of the first sublayer is closer to mobility $\mu_{sup2}$ than to mobility $\mu_{sup1}$;
  The semiconductor layer comprises:
    a first sublayer of organic semiconductor material having a mobility $\mu_{sup}$ which is in contact with the insulating layer and occupies at least 50% of the conduction channel when a voltage is applied to the gate electrode, and
    a second sublayer of an organic semiconductor material having a mobility $\mu_{inf}$ interposed between the first sublayer and the drain and source electrodes so as to physically isolate the first sublayer from the drain and source electrodes;
  The semiconductor layer comprises only the first and second sublayers with these two sublayers being directly physically in contact with each other and the mobility of the charge carriers changing abruptly from mobility $\mu_{inf}$ to mobility $\mu_{sup}$ at the interface between these two sublayers;
  X exceeds 100 and preferably exceeds 1000;
  The first portion encompasses at least 80% of the volume of the conduction channel;
  Mobility $\mu_{inf}$ measured in the linear regime is less than $10^{-3}$ cm$^2$V$^{-1}$s$^{-1}$ and mobility $\mu_{sup}$ measured in the linear regime exceeds $10^{-1}$ cm$^2$V$^{-1}$s$^{-1}$, the linear regime being a regime in which voltage $V_{DS}$ between the drain and source electrodes is equal to or less than voltage $V_G$ applied to the gate electrode in order to maintain the transistor in the "on" state.

The embodiments of the organic transistor also have the following advantages:

integration, in the organic semiconductor of the first sublayer, of inorganic semiconductor particles which make it possible to increase the mobility of this organic semiconductor while preserving its flexibility,
  use of a first and a second sublayers in order to produce the first and second portions respectively simplifies fabrication of the organic transistor,
  use of only the first and second sublayers whose mobility is homogeneous throughout its thickness simplifies fabrication,
  choosing a value of X which exceeds 100 or 1000 increases the $I_{on}/I_{off}$ ratio, and
  placing the first portion mainly in the area where the conduction channel appears makes it possible to obtain a current $I_{on}$ which is close to that which would be obtained if the semiconductor layer were made only of the same organic semiconductor as that used for the first portion.

The object of the invention is also a method for producing an organic field effect transistor, this method involving:
  producing the drain and source electrodes,
  producing a semiconductor layer made of an organic semiconductor material arranged between the drain and source electrodes,
  producing at least one gate electrode capable of creating an electric field which increases the density of the mobile charge carriers in the semiconductor layer in order to create a conduction channel in this semiconductor layer between the drain and source electrodes when a voltage $V_G$ is applied to the gate electrode, thus making it possible to switch the transistor from an "off" state to an "on" state,
  producing, directly in contact with the semiconductor layer, an electrically insulating layer interposed between the gate electrode and the semiconductor layer.

This method is characterized in that producing the semiconductor layer involves:
  producing a first portion of the semiconductor layer made of an organic semiconductor material having mobility $\mu_{sup}$, and
  producing a second portion of the semiconductor layer made of an organic semiconductor material having mobility $\mu_{inf}$,
the mobility $\mu_{sup}$ the electrical charge carriers in the first portion being X times greater than the mobility $\mu_{inf}$ of the electrical charge carriers in the second portion when these mobilities $\mu_{inf}$ and $\mu_{sup}$ are measured under the same conditions, X being a number equal to or greater than ten, the first portion corresponding to 10% of the volume of the semiconductor layer closest to the gate electrode and the second portion corresponding to 10% of the volume of the semiconductor layer closest to the drain and source electrodes.

BRIEF DESCRIPTION OF THE DRAWINGS

The invention will be made more readily understandable by the following description which is given merely by way of example and relates to the accompanying drawings in which.

DETAILED DESCRIPTION OF THE INVENTION

In these Figures, identical reference numbers are used to denote identical elements.

Those characteristics and functions which are well known to those skilled in the art are not described in detail in the rest of this description.

Figure 1:
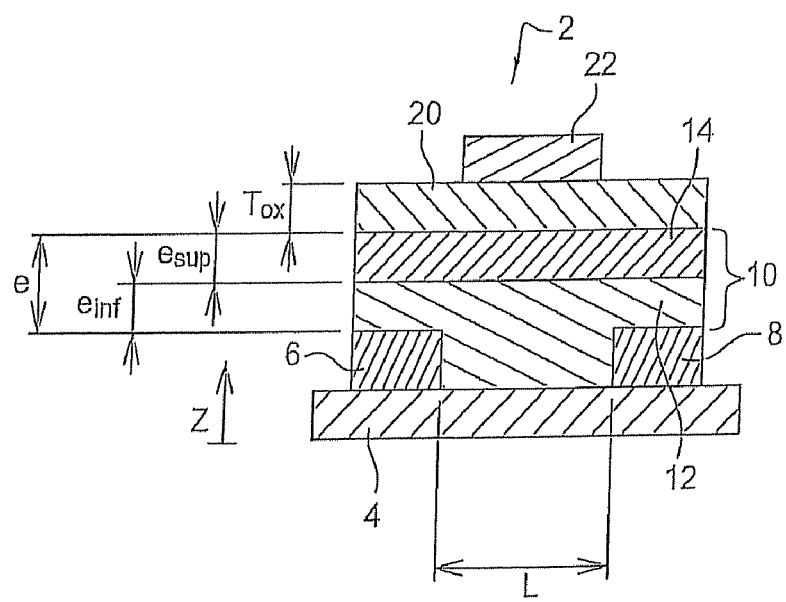
FIG. 1 is a schematic view of a first embodiment of an organic field effect transistor.

FIG. 1 shows a vertical cross-section through organic field effect organic transistor 2. Transistor 2 comprises substrate 4 on which a source electrode 6 and a drain electrode 8 are produced directly. The source and drain electrodes are spaced apart by a channel having a width which equals distance L. Distance L is the shortest distance separating electrodes 6 and 8. In order to improve the response time of organic transistor 2, the smallest possible distance L is chosen; this distance is preferably less than 10 μm.

Semiconductor layer 10 is deposited on top of electrodes 6 and 8. This layer 10 is physically and electrically in direct contact with electrodes 6 and 8 and fills the space which separates electrodes 6 and 8. The expression "in direct contact" here denotes the fact that contact is obtained without going via any intermediate layer. The minimum thickness e of layer 10 which separates electrodes 6, 8 from an electrically insulating layer is 10 nm to 400 nm. Here, this thickness is measured in vertical direction Z perpendicular to the face of substrate 4 on which the various electrodes and layers which form organic transistor 2 are deposited.

Semiconductor layer 10 is formed by a lower sublayer 12 on which an upper sublayer 14 is superposed.

Lower sublayer 12 is electrically and physically in direct contact with electrodes 6 and 8 and fills the space which separates electrodes 6 and 8. The upper face of sublayer 12 is electrically and physically in direct contact with the lower face of sublayer 14.

The volume of lower sublayer 12 encompasses at least 10% of the volume of semiconductor layer 10 which is closest to electrodes 6 and 8. For example, to achieve this, the minimum thickness $e_{inf}$ of sublayer 12 which separates one of the electrodes 6, 8 from sublayer 14 represents at least 10% of thickness e but no more than 90% of thickness e. For example, here, thickness $e_{inf}$ equals half the thickness e.

The thickness $e_{inf}$ of this sublayer 12 is 10 nm to 300 mm

Similarly, the volume of sublayer 14 encompasses at least 10% of the volume of layer 10 closest to the gate electrode. For example, to achieve this, the minimum thickness $e_{sup}$ of sublayer 14 which separates the electrically insulating layer from sublayer 14 also represents at least 10% of thickness e but no more than 90% of thickness e. For example, here, thickness $e_{sup}$ is chosen so that it equals half the thickness e.

The dimensions of sublayer 12 in a horizontal plane perpendicular to direction Z are sufficiently large to accommodate electrodes 6 and 8 as well as the channel which separates these electrodes. Thus, sublayer 12 physically isolates sublayer 14 from electrodes 6 and 8.

The dimensions of sublayer 14 are chosen so that they are sufficiently large to make sure that at least 50% of the volume of the conduction channel, which forms when a potential is applied to a gate electrode of organic transistor 2, is occupied by this sublayer 14. For example, here, the dimensions in the horizontal plane of sublayer 14 are chosen so that they are identical to the lateral dimensions of sublayer 12. Thus, sublayer 14 occupies the entire volume of the conduction channel More than 90% and preferably more than 99% of the volume of sublayer 12 consists of an organic semiconductor material which has mobility $\mu_{inf}$. The organic semiconductor material used to produce sublayer 12 is selected so that it has lower mobility, i.e. mobility less than $10^{-3}$ cm$^{-2}$V$^{-1}$ s$^{-1}$. For example, the organic semiconductor material is polythiophene. Sublayer 14 is produced directly above sublayer 12. More than 90% and preferably more than 99% of the volume of this sublayer 14 consists of an organic semiconductor material which has mobility $\mu_{sup}$. The organic semiconductor material used to produce sublayer 14 is selected so that it has higher mobility, i.e. mobility in excess of $10^{-1}$ cm$^2$V$^{-1}$ s$^{-1}$. Mobility $\mu_{sup}$ preferably exceeds 100.

For example, here, sublayer 14 is made of pentacene which has a mobility of approximately 1 cm$^2$V$^{-1}$ s$^{-1}$.

The volume of sublayer 14 encompasses at least 50% and preferably at least 80% of the volume of the conduction channel between electrodes 6 and 8 when organic transistor 2 is in the "on" state. Here, the volume of sublayer 14 encompasses more than 99% of the volume of the conduction channel.

Mobility $\mu_{inf}$ or $\mu_{sup}$ is constant throughout the entire volume of sublayer 12 or 14. Electrically insulating layer or dielectric layer 20 (hereinafter layer 20) is provided on top of sublayer 14. The lower face of this layer 20 is physically in direct contact with the upper face of sublayer 14. This layer 20 makes it possible to electrically insulate gate electrode 22 from semiconductor sublayer 10.

In order to improve the performance of organic transistor 2, layer 20 is built to have the highest possible capacitance $C_i$. To achieve this, its thickness in the vertical direction is chosen so that it is as small as possible. Its thickness is typically less than 100 nm. Conversely, its relative permittivity $\in_r$ is chosen so that it is as high as possible.

Gate electrode 22 is placed substantially above the space which separates electrodes 6 and 8. This gate electrode is capable of creating an electric field which increases the density of the electrical charge carriers at the interface between layers 10 and 20 so as to create a conduction channel in sublayer 14. However, given that layer 20 is an electrical insulator, the charge carriers capable of moving are located exclusively on the same side as layer 10. The thickness of the conduction channel in direction Z is typically less than 4 nm and often less than 2 nm. The conduction channel allows charges to flow between electrodes 6 and 8 when a voltage is also applied between these electrodes. In this state, organic transistor 2 is said to be in the "on" state. Conversely, when no voltage is applied to electrode 22, no conduction channel is created so that only a very weak current $I_{off}$ can flow between electrodes 6 and 8 when voltage $V_{DS}$ is applied between them. Here, the voltage $V_G$ applied to electrode 22 to switch organic transistor 2 from the "off" state to the "on" state is negative.

In order to obtain an improvement in the $I_{on}/I_{off}$ ratio of organic transistor 2 compared with situations where layer 10 is made exclusively of an organic semiconductor material having mobility $\mu_{inf}$ or $\mu_{sup}$, the material of sublayer 14 is chosen so that it has a mobility $\mu_{sup}$ which is at least 10 times higher than mobility $\mu_{inf}$. The material of sublayer 14 is preferably chosen so that it has mobility $\mu_{sup}$ which is greater than $100\mu_{inf}$ or $1000\mu_{inf}$ or even $10^5\mu_{inf}$. In fact, the higher the ratio $\mu_{sup}/\mu_{inf}$ the better the ratio $I_{on}/I_{off}$.

Figure 2:
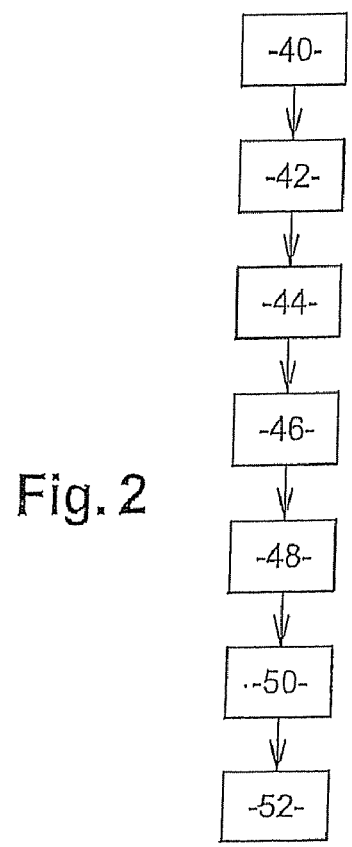
FIG. 2 is a flowchart of a method for producing the transistor in FIG. 1.

FIG. 2 shows a method for producing organic transistor 2. In step 40, substrate 4 is prepared so that it can be used as a basis for producing a transistor.

In step 42, electrodes 6 and 8 are produced on substrate 4. For example, in step 42, electrodes 6 and 8 are deposited on substrate 4 or implanted in substrate 4 by using a method for doping.

Then, in step 44, sublayer 12 is deposited on electrodes 6 and 8 and on substrate 4. For example, sublayer 12 is deposited or produced by implanting it in step 44.

Once sublayer 12 has been produced, sublayer 14 is deposited on sublayer 12 in step 46. For example, sublayer 14 is deposited on sublayer 12 or produced by implanting it in step 46.

Insulating layer 20 is deposited on sublayer 14 in step 48. This insulating layer is, for instance, deposited by evaporation or produced by annealing.

Then, in step 50, electrode 22 is deposited on layer 20. Electrode 22 can be produced on layer 20 by photolithography or by physical masking.

Finally, organic transistor 2 thus produced is electrically tested in step 52 in order to verify its ability to switch between the "on" state and "off" state.

In transistor 2, source and drain electrodes 6 and 8 are located underneath semiconductor layer 10. This configuration is referred to as "top contact".

Figure 3:
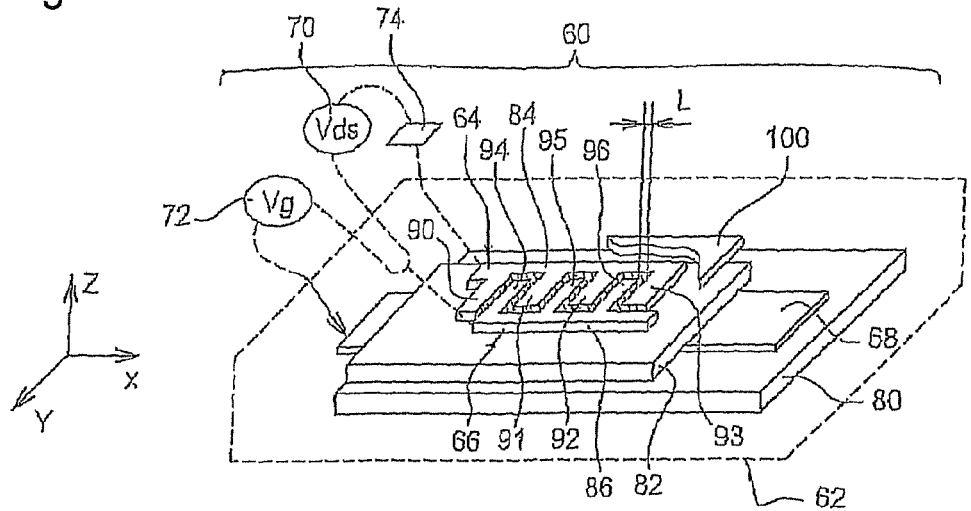
FIG. 3 shows a setup for measuring the carrier mobility of an organic semiconductor.

FIG. 3 shows a perspective view of a setup 60 which is used to measure the carrier mobility of a layer made of an organic semiconductor material.

This setup comprises organic transistor 62 equipped with drain electrode 64, source electrode 66 and gate electrode 68. The setup also comprises DC voltage $V_{DS}$ source 70 which is connected between electrodes 64 and 66 and DC voltage $V_G$ source 72 which is electrically connected to electrode 68.

Finally, setup 60 comprises ammeter 74 which is capable of measuring current $I_{DS}$ which flows between electrodes 64 and 66.

More precisely, organic transistor 62 is formed by substrate 80 on which gate electrode 68 is deposited. Layer 82 made of an electrically insulating material is interposed between electrode 68 and electrodes 64 and 66. Layer 82 extends in a horizontal plane which is parallel to directions X and Y. The thickness of layer 82, whose vertical direction Z is constant, is known.

Electrodes 64 and 66 are located directly above layer 82.

Each electrode 64 and 66 is formed by a bar, 84 and 86 respectively, which extends parallel to direction X. In addition, electrode 64 comprises fingers 90 to 93 which extend parallel to each other in direction Y towards bar 86 of electrode 66. These fingers 90 to 93 are separated from each other in direction X by interdigital gaps.

Electrode 66 also comprises fingers 94 to 96 which extend parallel to each other in direction Y towards bar 84.

Each of these fingers 94 to 96 is located in a respective interdigital gap defined by fingers 90 to 93.

The faces of electrode 64 which are opposite the corresponding faces of electrode 66 are spaced a constant distance apart, this distance is denoted L here. In addition, this spacing between the opposite faces of electrodes 64 to 66 defines a channel (hatched in FIG. 3) which zigzags between the various fingers 90 to 93 and 94 to 96. The length of this channel which zigzags between fingers 90 to 96, measured from its input to its output, is denoted W. Length W is therefore substantially equal to the length of the faces of electrodes 64 and 66 which are opposite facing.

A layer 100 of organic semiconductor material, the mobility of which is to be measured, is placed on electrodes 64 and 66. In FIG. 3, this layer 100 is only partially shown. This layer 100 also fills the gaps between electrodes 64 and 66, especially the channel defined by these gaps. Here, layer 100 is a layer which has a homogeneous mobility, i.e. its mobility does not vary in direction Z. Here, it is also assumed that the mobility of layer 100 does not vary depending on its depth in direction Z.

Using device 60, it is possible to plot, for a voltage $V_G$ applied to the gate, changes in the intensity of current $I_{DS}$ as a function of voltage $V_{DS}$ which is applied between electrodes 64 and 66.

Figure 4:
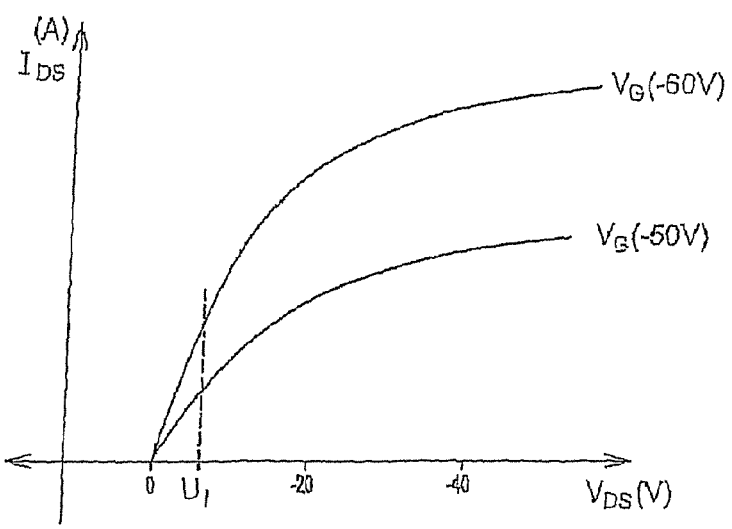
FIG. 4 is a graph showing changes in the intensity of the current which flows through the transistor in FIG. 1 as a function of the voltage $V_{DS}$ applied between its drain and source electrodes for various values of gate voltage $V_G$.

The curves obtained for voltage $V_G$ equaling −60 V and −50 V are shown schematically in FIG. 4.

One can define two regimes, namely a linear regime and a steady-state regime, on the basis of these curves. In the linear regime, the intensity of current $I_{DS}$ is directly proportional to voltage $V_{DS}$.

Conversely, in the saturation regime, this proportionality relationship no longer applies.

In FIG. 4, the voltage $V_{DS}$ beyond which the regime is no longer linear is denoted $U_1$.

In the linear regime, the mobility of semiconductor material 100 is determined by means of the following equation:

$$\mu = \frac{g_m L}{W C_i V_{DS}} \quad (2)$$

where:
  $g_m$ is the transconductance which equals the coefficient of proportionality between the intensity of current $I_{DS}$ and voltage $V_{DS}$ in the linear regime,
  L and W are, respectively, the width and the length of the channel which zigzags between electrodes 64 and 66,
  $C_i$ is the capacitance of the capacitor formed by insulating layer 82 located between gate electrode 68 and electrodes 64 and 66, and
  $V_{DS}$ is the voltage between electrodes 64 and 66 for which the mobility is measured.

The examples of mobility values given above are for cases where mobility is measured in the linear regime.

Nevertheless, it is also possible to measure the mobility of the organic semiconductor material in the non-linear regime, i.e. when voltage $V_{DS}$ exceeds voltage $V_G$ which is applied at the same instant to gate electrode 68.

Figure 5:
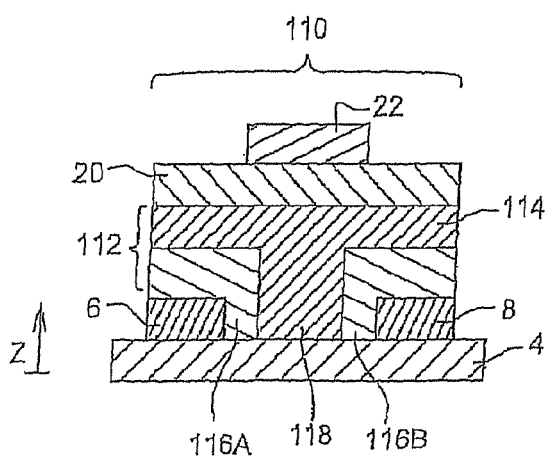
FIG. 5 is a view of another embodiment of an organic transistor.

FIG. 5 shows a second embodiment of an organic transistor 110. This organic transistor 110 is identical to organic transistor 2 apart from the fact that semiconductor layer 10 is replaced by semiconductor layer 112. Here, semiconductor layer 112 is also formed by an upper sublayer 114 superposed on a lower sublayer. The upper and lower sublayers are, for example, made of the same materials as sublayers 14 and 12 respectively. However, here, the lower sublayer is formed in two parts 116A and 116B. Part 116A physically isolates electrode 6 from upper sublayer 114.

Part 116B physically isolates electrode 8 from upper sublayer 114. In contrast to organic transistor 2, parts 116A and 116B are physically isolated from each other. For example, here, space 118 which separates parts 116A and 116B is filled with an organic semiconductor material which is identical to that of upper sublayer 114.

Many other embodiments are possible. For instance, each of the sublayers made of a semiconductor material can be formed either by a single organic semiconductor material, as described above, or by a mixture of several organic semiconductor materials. In every case, at least 90% and preferably at least 99% of the volume of the sublayer made of a semiconductor material is occupied by the organic semiconductor material or the mixture of organic semiconductor materials.

The mixture of organic semiconductor materials is preferably homogenous throughout the volume of the sublayer.

In the case of upper sublayer 14 or 114, all or at least part of the volume of the sublayer which is not occupied by the semiconductor materials may contain inorganic particles such as nanotubes or conductive silicon filaments. The organic semiconductor material then forms a matrix of organic semiconductor material into which these inorganic particles are then introduced. The inorganic particles represent less than 10% and preferably less than 1% of the volume of the organic semiconductor sublayer. The diameter of the nanotubes or conductive filaments exceeds 10 nm and is preferably less than 100 nm. The length of the nanotubes or conductive filaments exceeds 10 nm and is preferably greater than 2 or 5 μm. Introducing particles having a mobility $\mu_{sup2}$ which is much higher than the mobility $\mu_{sup1}$ of the matrix of organic semiconductor material makes it possible to obtain an organic semiconductor material whose mobility is closer to mobility $\mu_{sup2}$ than to mobility $\mu_{sup1}$. This way, one can produce organic semiconductor materials having an extremely high mobility. Such a material is especially useful for producing sublayer 14 or 114.

In the embodiments described here, layer 20 is made of an electrically insulating material which has a high relative permittivity, i.e. a relative permittivity in excess of 4 or 5. Nevertheless, lower permittivities, i.e. less than 2 or 3, are also possible. In other embodiments, the electrically insulating layer is also formed by several sublayers which each have different relative permittivities. Layer 20 can be made of an organic or inorganic material.

Here, organic transistors 2 and 110 described above represent a special case where the semiconductor layer is formed by only two sublayers. Nevertheless, it is possible to interpose one or more intermediate sublayers, made of an organic semiconductor material, between sublayers 12 and 14. The total thicknesses $e_{inf}$ and $e_{sup}$ are then strictly less than thickness e. In this case, sublayers 12, 14 and the intermediate layers are stacked on top of each other in order of mobility so as to create an increasing mobility gradient moving from the drain and source electrodes towards the gate electrode. In the case of a "top contact" configuration, the gradient increases in direction Z.

Typically, for example if sublayers made of an organic semiconductor material are deposited one on top of the other, mobility varies abruptly from one sublayer to the next. In other words, the drift in mobility μ as a function of height z in direction Z exhibits extreme values at the level of each interface between two successive sublayers. In such an embodiment, it is therefore possible to distinguish the various sublayers from each other thanks to sudden variations in mobility μ.

In extreme cases, even the upper and lower sublayers are each formed by a stack of sheets of organic semiconductor material with mobility being homogeneous and uniform within each sheet. In this extreme case, the upper sublayer consists of 10% of the total volume of the semiconductor layer which is closest to the gate electrode. The lower sublayer consists of 10% of the volume of the semiconductor layer which is closest to the drain and source electrodes.

Alternatively, the various layers of organic semiconductor material are replaced by a single sublayer in which mobility varies gradually from mobility $\mu_{inf}$ to mobility $\mu_{sup}$ as a function of height z. The drift in mobility μ as a function of height z therefore exhibits no extreme values.

The organic semiconductor materials can be P type or N type. They can be in the form of polymers or crystals. The semiconductor materials which make up the first portion or sublayer 14 and the second portion or sublayer 12, for example, can be chosen as organic semiconductor materials having doping of the same type, namely N type or P type.

In the embodiments described above, the source and drain electrodes are located underneath the semiconductor layer. This configuration is referred to as "top contact". Nevertheless, all the descriptions given in the particular case of this "top contact" configuration apply equally to the configuration referred to as "bottom contact", i.e. a configuration in which the source and drain electrodes are arranged above the semiconductor layer.

The above descriptions also apply equally if the order in which the layers and electrodes are stacked is reversed. For instance, it is possible to produce an organic transistor in which it is the gate electrode which is deposited on substrate 4. Above this gate electrode and in the following order, there is the layer of electrically insulating material, then the semiconductor layer and finally the source and drain electrodes. In this configuration, given the fact that the gate electrode is located at the bottom, the sublayer having the highest mobility is located below the sublayer having the lowest mobility.

The source and drain electrodes preferably have interlaced digits as described in relation to FIG. 3.

The invention claimed is:

1. An organic field effect transistor comprising: drain and source electrodes,
   a semiconductor layer made of an organic semiconductor material arranged between the drain and source electrodes,
   at least one gate electrode capable of creating an electric field which increases a density of mobile charge carriers in the semiconductor layer in order to create a conduction channel in the semiconductor layer between the drain and source electrodes when a voltage $V_G$ is applied to the gate electrode, thus making it possible to switch the organic field effect transistor from an "off" state to an "on" state, and
   an electrically insulating layer interposed between the gate electrode and the semiconductor layer with the insulating layer being directly in contact with the semiconductor layer,
   wherein the semiconductor layer closest to the gate electrode comprises a first portion which has a mobility $\mu_{sup}$ greater than a mobility $\mu_{inf}$ of a second portion of the semiconductor layer located closest to the source and drain electrodes, the second portion being interposed between the first portion and the source and drain electrodes.

2. The transistor as claimed in claim 1, wherein the first portion corresponds to 10% of the volume of the semiconductor layer closest to the gate electrode and the second portion corresponds to 10% of the volume of the semiconductor layer closest to the drain and source electrodes, with the mobility $\mu_{sup}$ of charge carriers in the first portion of the semiconductor layer being X times greater than the mobility $\mu_{inf}$ of charge carriers in the second portion of the semiconductor layer, X being a number equal to or greater than 10.

3. The transistor as claimed in claim 2, wherein X exceeds 100.

4. The transistor as claimed in claim 3, wherein X exceeds 1000.

5. The transistor as claimed in claim 1, wherein semiconductor layer comprises:
   a first sublayer of organic semiconductor material having mobility $\mu_{sup}$ which is in contact with the insulating layer and constitutes the first portion, a second sublayer of organic semiconductor material having mobility $\mu_{inf}$ which constitutes the second portion and is interposed between, firstly, the first sublayer and, secondly, the drain and source electrodes.

6. The transistor as claimed in claim 5, wherein the first sublayer occupies at least 50% of the conduction channel when a voltage is applied to the gate electrode.

7. The transistor as claimed in claim 5, wherein the semiconductor layer comprises only the first and second sublayers with these two sublayers being directly physically in contact with each other and the mobility of the charge carriers changing from mobility $\mu_{inf}$ to mobility $\mu_{sup}$ at the interface between these two sublayers.

8. The transistor as claimed in claim 1, wherein the first portion comprises:
- a matrix of an organic semiconductor material having a mobility $\mu_{sup}$ which occupies at least 90% of the first portion, and
- inorganic semiconductor materials comprising inorganic semiconductor particles having a mobility $\mu_{sup2}$ which are uniformly distributed throughout the matrix and occupy at least 10% of the first portion, wherein the smallest width of the inorganic semiconductor materials exceeds 10 nm.

9. The transistor as claimed in claim 1 wherein the first portion encompasses at least 80% of a volume of the conduction channel.

10. The transistor as claimed in claim 1, wherein mobility $\mu_{inf}$ measured in a linear regime is less than $10^{-3}$ cm$^2$V$^{-1}$ s$^{-1}$ and mobility $\mu_{sup}$ measured in the linear regime exceeds $10^{-1}$ cm$^2$V$^{-1}$ s$^{-1}$, the linear regime being a regime in which voltage $V_{DS}$ between the drain and source electrodes is equal to or less than voltage $V_G$ applied to the gate electrode in order to maintain the transistor in an "on" state.

11. The transistor as claimed in claim 1, wherein the second portion of the semiconductor layer located closest to the source and drain electrodes is made of polythiophene.

12. Method for producing an organic field effect transistor, the method comprising:
- producing the drain and source electrodes,
- producing a semiconductor layer made of an organic semiconductor material arranged between the drain and source electrodes,
- producing at least one gate electrode capable of creating an electric field which increases a density of mobile charge carriers in the semiconductor layer in order to create a conduction channel in the semiconductor layer between the drain and source electrodes when a voltage $V_G$ is applied to the gate electrode, thus making it possible to switch the transistor from an "off" state to an "on" state,
- producing directly in contact with the semiconductor layer, an electrically insulating layer interposed between the gate electrode and the semiconductor layer, wherein producing the semiconductor layer further comprises:
- producing a first portion of the semiconductor layer made of an organic semiconductor material having mobility $\mu_{sup}$, and
- producing a second portion of the semiconductor layer made of an organic semiconductor material having mobility $\mu_{inf}$, the mobility $\mu_{sup}$ of the charge carriers in the first portion being X times greater than the mobility $\mu_{inf}$ of the charge carriers in the second portion, X being a number equal to or greater than ten, the first portion corresponding to 10% of a volume of the semiconductor layer closest to the gate electrode and the second portion corresponding to 10% of the volume of a semiconductor layer closest to the drain and source electrodes.

* * * * *